(12) United States Patent
Choi (10) Patent No.: US 8,769,240 B2
(45) Date of Patent: Jul. 1, 2014

(54) INTEGRATED CIRCUIT AND SEMICONDUCTOR MEMORY DEVICE USING THE SAME

(75) Inventor: Dae-Il Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 21 days.

(21) Appl. No.: 13/333,622

(22) Filed: Dec. 21, 2011

(65) Prior Publication Data

US 2013/0031329 A1 Jan. 31, 2013

(30) Foreign Application Priority Data

Apr. 29, 2011 (KR) .................. 10-2011-0040802

(51) Int. Cl.
*G06F 12/02* (2006.01)
(52) U.S. Cl.
CPC .................. *G06F 12/0207* (2013.01)
USPC .......................................................... 711/202
(58) Field of Classification Search
CPC G06F 12/023; G06F 12/0246; G06F 12/0207
See application file for complete search history.

(56) References Cited

U.S. PATENT DOCUMENTS

| | | | | |
|---|---|---|---|---|
| 6,865,660 B2* | 3/2005 | Duncan | .................. | 711/217 |
| 7,801,300 B2* | 9/2010 | Fuse et al. | .................. | 380/28 |
| 2003/0177432 A1* | 9/2003 | Yamamoto et al. | .......... | 714/755 |

FOREIGN PATENT DOCUMENTS

| | | |
|---|---|---|
| KR | 1020090014675 | 2/2009 |
| KR | 1020100111990 | 10/2010 |

OTHER PUBLICATIONS

Notice of Allowance issued by the Korean Intellectual Property Office on Jan. 24, 2013.

* cited by examiner

*Primary Examiner* — Hiep Nguyen
(74) *Attorney, Agent, or Firm* — IP & T Group LLP (57) ABSTRACT

An integrated circuit includes a random address generation unit configured to generate a first random address for a data randomizing operation, an address conversion unit configured to convert the first random address and generate a second random address, and a synchronization output unit configured to sequentially output the first and second random addresses in synchronization with a clock signal.

19 Claims, 7 Drawing Sheets

| PERIOD | RA1 | RA2 | PERIOD | RA1 | RA2 | PERIOD | RA1 | RA2 | PERIOD | RA1 | RA2 |
|---|---|---|---|---|---|---|---|---|---|---|---|
| 1 | FC | 3 | 21 | 53 | AC | 41 | 96 | 69 | 61 | 5F | A0 |
| 2 | F8 | 7 | 22 | A7 | 58 | 42 | 2D | D2 | 62 | BF | 40 |
| 3 | F0 | 0F | 23 | 4F | B0 | 43 | 5B | A4 | 63 | 7E | 81 |
| 4 | E0 | 1F | 24 | 9E | 61 | 44 | B7 | 48 | 1 | FC | 3 |
| 5 | C1 | 3E | 25 | 3D | C2 | 45 | 6E | 91 | 2 | F8 | 7 |
| 6 | 82 | 7D | 26 | 7A | 85 | 46 | DD | 22 | 3 | F0 | 0F |
| 7 | 4 | FB | 27 | F4 | 0B | 47 | B3 | 44 | 4 | E0 | 1F |
| 8 | 8 | F7 | 28 | E8 | 17 | 48 | 76 | 89 | 5 | C1 | 3E |
| 9 | 10 | EF | 29 | D1 | 2E | 49 | EC | 13 | 6 | 82 | 7D |
| 10 | 21 | DE | 30 | A3 | 5C | 50 | D9 | 26 | 7 | 4 | FB |
| 11 | 43 | BC | 31 | 47 | B8 | 51 | B3 | 4C | 8 | 8 | F7 |
| 12 | 86 | 79 | 32 | 8E | 71 | 52 | 66 | 99 | 9 | 10 | EF |
| 13 | 0C | F3 | 33 | 1C | E3 | 53 | CD | 32 | 10 | 21 | DE |
| 14 | 18 | E7 | 34 | 39 | C6 | 54 | 9A | 65 | 11 | 43 | BC |
| 15 | 31 | CE | 35 | 72 | 8D | 55 | 35 | CA | 12 | 86 | 79 |
| 16 | 62 | 9D | 36 | E4 | 1B | 56 | 6A | 95 | 13 | 0C | F3 |
| 17 | C5 | 3A | 37 | C9 | 36 | 57 | D5 | 2A | 14 | 18 | E7 |
| 18 | 8A | 75 | 38 | 92 | 6D | 58 | AB | 54 | 15 | 31 | CE |
| 19 | 14 | EB | 39 | 25 | DA | 59 | 57 | A8 | 16 | 62 | 9D |
| 20 | 29 | D6 | 40 | 4B | B4 | 60 | AF | 50 | 17 | C5 | 3A |

| PERIOD | RA1 | RA2 | PERIOD | RA1 | RA2 | PERIOD | RA1 | RA2 |
|---|---|---|---|---|---|---|---|---|
| 1 | FC | 3 | 21 | 53 | AC | 41 | 96 | 69 |
| 2 | F8 | 7 | 22 | A7 | 58 | 42 | 2D | D2 |
| 3 | F0 | 0F | 23 | 4F | B0 | 43 | 5B | A4 |
| 4 | E0 | 1F | 24 | 9E | 61 | 44 | B7 | 48 |
| 5 | C1 | 3E | 25 | 3D | C2 | 45 | 6E | 91 |
| 6 | 82 | 7D | 26 | 7A | 85 | 46 | DD | 22 |
| 7 | 4 | FB | 27 | F4 | 0B | 47 | BB | 44 |
| 8 | 8 | F7 | 28 | E8 | 17 | 48 | 76 | 89 |
| 9 | 10 | EF | 29 | D1 | 2E | 49 | EC | 13 |
| 10 | 21 | DE | 30 | A3 | 5C | 50 | D9 | 26 |
| 11 | 43 | BC | 31 | 47 | B8 | 51 | B3 | 4C |
| 12 | 86 | 79 | 32 | 8E | 71 | 52 | 66 | 99 |
| 13 | 0C | F3 | 33 | 1C | E3 | 53 | CD | 32 |
| 14 | 18 | E7 | 34 | 39 | C6 | 54 | 9A | 65 |
| 15 | 31 | CE | 35 | 72 | 8D | 55 | 35 | CA |
| 16 | 62 | 9D | 36 | E4 | 1B | 56 | 6A | 95 |
| 17 | C5 | 3A | 37 | C9 | 36 | 57 | D5 | 2A |
| 18 | 8A | 75 | 38 | 92 | 6D | 58 | AB | 54 |
| 19 | 14 | EB | 39 | 25 | DA | 59 | 57 | A8 |
| 20 | 29 | D6 | 40 | 4B | B4 | 60 | AF | 50 |
| | | | | | | 61 | 5F | A0 |
| | | | | | | 62 | BF | 40 |
| | | | | | | 63 | 7E | 81 |
| | | | | | | 1 | FC | 3 |
| | | | | | | 2 | F8 | 7 |
| | | | | | | 3 | F0 | 0F |
| | | | | | | 4 | E0 | 1F |
| | | | | | | 5 | C1 | 3E |
| | | | | | | 6 | 82 | 7D |
| | | | | | | 7 | 4 | FB |
| | | | | | | 8 | 8 | F7 |
| | | | | | | 9 | 10 | EF |
| | | | | | | 10 | 21 | DE |
| | | | | | | 11 | 43 | BC |
| | | | | | | 12 | 86 | 79 |
| | | | | | | 13 | 0C | F3 |
| | | | | | | 14 | 18 | E7 |
| | | | | | | 15 | 31 | CE |
| | | | | | | 16 | 62 | 9D |
| | | | | | | 17 | C5 | 3A |

INTEGRATED CIRCUIT AND SEMICONDUCTOR MEMORY DEVICE USING THE SAME

CROSS-REFERENCE TO RELATED APPLICATIONS

The present application claims priority of Korean Patent Application No. 10-2011-0040802, filed on Apr. 29, 2011, which is incorporated herein by reference in its entirety.

BACKGROUND

1. Field

Exemplary embodiments of the present invention relate to semiconductor design technology, and particularly, to a semiconductor memory device for storing data.

2. Description of the Related Art

In general, a semiconductor memory device is classified into a volatile memory device such as a dynamic random access memory (DRAM) or a static random access memory (SRAM) and a nonvolatile memory device such as a programmable read only memory (PROM), an erasable PROM (EPROM), or an electrically EPROM (EEPROM). The volatile memory device is distinguished from the nonvolatile memory device depending on whether data stored in a memory cell is retained after a certain time passes. In other words, in the volatile memory device, the data stored in the memory cell is not retained after the certain time passes. However, in the nonvolatile memory device, the data stored in the memory cell is retained after the certain time passes. Thus, in the case of the volatile memory device, a refresh operation is to be performed in order to retain data. However, the nonvolatile memory device may retain data without performing the refresh operation. Since the advantages of the nonvolatile memory device are suitable for low power consumption and high integration, the nonvolatile memory device has been extensively used as a storage medium of a portable device.

Meanwhile, with the development of the process technology of the semiconductor memory device, the degree of integration of the semiconductor memory device has been significantly increased. With the increase in the degree of integration, the chip size of the semiconductor memory device has been significantly reduced, and a distance between memory cells provided in the semiconductor memory device has also been significantly decreased. As a result, the distance has been decreased to such an extent that data stored in adjacent memory cells may have influence on each other. In this regard, in order to minimize interference between the adjacent memory cells, technology for randomizing and storing data has been developed. For such a data randomizing operation, an integrated circuit such as a linear feedback shift register and a seed value generator is generally used.

Figure 1:
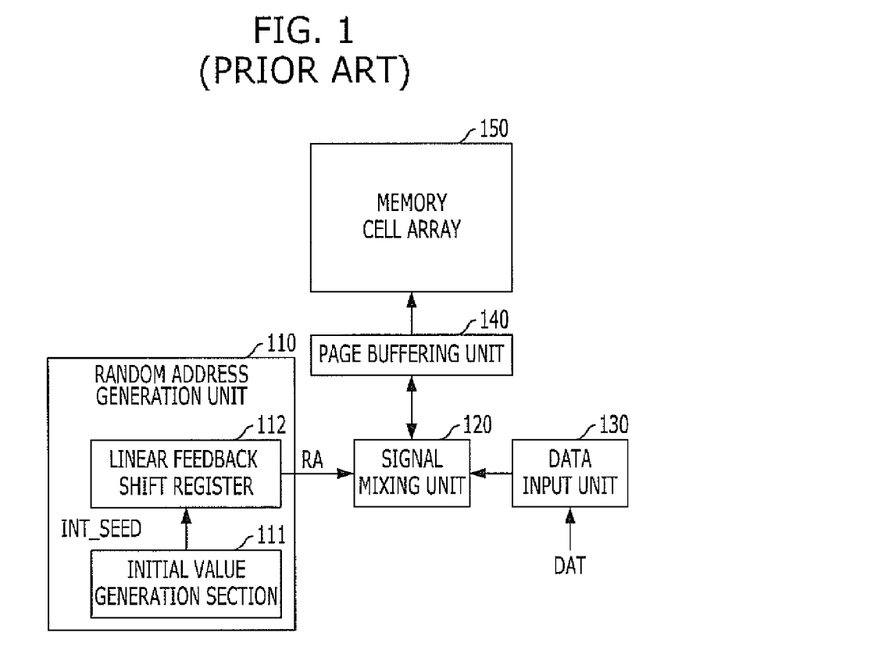
FIG. 1 is a block diagram illustrating a partial configuration of a conventional semiconductor memory device.

FIG. 1 is a block diagram illustrating a partial configuration of a conventional semiconductor memory device.

Referring to FIG. 1, the semiconductor memory device includes a random address generation unit 110, a signal mixing unit 120, a data input unit 130, a page buffering unit 140, and a memory cell array 150.

The random address generation unit 110 is for generating a random address RA and includes an initial value generation section 111 and a linear feedback shift register 112. The random address RA output from the linear feedback shift register 112 is to be matched with a column address due to the basic structure of the linear feedback shift register 112. Thus, the semiconductor memory device includes the initial value generation section 111 in order to ensure such a matching operation. The linear feedback shift register 112 generates the random address RA based on a seed value INT_SEED provided from the initial value generation section 111, and the generated random address RA is an address matched with the column address.

The signal mixing unit 120 mixes data DAT input through the data input unit 130 with the random address RA and outputs a mixing result to the page buffering unit 140. The data input unit 130 is a circuit for receiving the data DAT provided from the outside, and the page buffering unit 140 is a circuit for performing read and write operations and storing data in the memory cell array 150 or outputting the stored data.

The capacity of a semiconductor memory device has been increased more and more, resulting in an increase in the number of address bits. The increase in the number of address bits represents that the number of bits of the random address RA generated by the random address generation unit 110 is also to be increased. This causes an increase in the area of the initial value generation section 111 and the linear feedback shift register 112. The initial value generation section 111 and the linear feedback shift register 112 are complicated in terms of circuit design and occupy a relatively large area. An increase in the area of the initial value generation section 111 and the linear feedback shift register 112 may cause a burden in circuit layout design.

SUMMARY

An exemplary embodiment of the present invention is directed to an integrated circuit that converts a random address used for a data randomizing operation and generates another random address.

An embodiment of the present invention is directed to a semiconductor memory device that mixes data using the integrated circuit.

In accordance with an exemplary embodiment of the present invention, an integrated circuit includes a random address generation unit configured to generate a first random address for a data randomizing operation, an address conversion unit configured to convert the first random address and generate a second random address, and a synchronization output unit configured to sequentially output the first and second random addresses in synchronization with a clock signal.

Specifically, the address conversion unit may convert the first random address to the second random address by logically combining the first random address with a set value.

In accordance with an exemplary embodiment of the present invention, a semiconductor memory device includes a random address generation unit configured to generate a first random address for a data randomizing operation, an address conversion unit configured to convert the first random address and generate a second random address, and a signal mixing unit configured to mix the first and second random addresses with data.

Specifically, the signal mixing unit may perform a mixing operation in response to a clock signal.

In accordance with an exemplary embodiment of the present invention, a method for operating a semiconductor memory device includes generating a first random address for a data randomizing operation, and generating a second random address by converting the first random address, outputting mix data by mixing the first and second random addresses with data, and storing the mix data in a memory cell array.

Specifically, the second random address may be generated by inverting the first random address.

In the generation of a random address, the integrated circuit in accordance with an embodiment of the present invention may secondarily convert a first random address primarily generated and generate a second random address different from the first random address. Furthermore, the integrated circuit in accordance with an exemplary embodiment of the present invention may perform a fast operation by using the first and second random addresses for a randomizing operation in response to the rising and falling edges of a clock signal.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
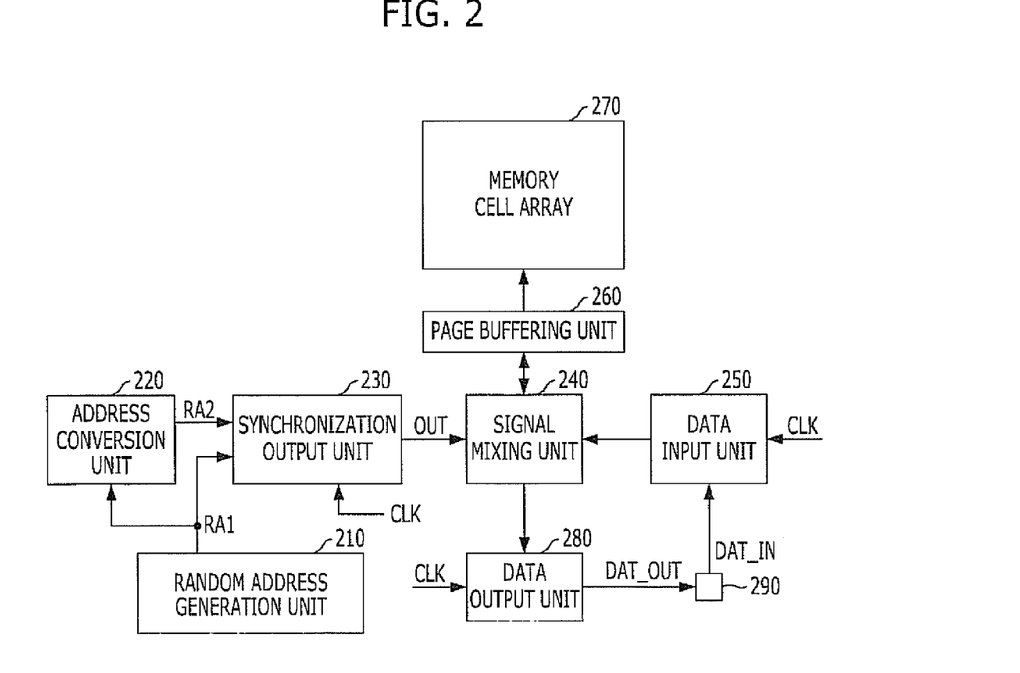
FIG. 2 is a block diagram illustrating a partial configuration of a semiconductor memory device in accordance with an exemplary embodiment of the present invention.

FIG. 2 is a block diagram illustrating a partial configuration of a semiconductor memory device in accordance with an exemplary embodiment of the present invention.

Referring to FIG. 2, the semiconductor memory device includes a random address generation unit 210, an address conversion unit 220, a synchronization output unit 230, a signal mixing unit 240, a data input unit 250, a page buffering unit 260, a memory cell array 270, a data output unit 280, and a data pad 290.

The random address generation unit 210 is configured to generate a first random address RA1 for a data randomizing operation, the address conversion unit 220 is configured to convert the first random address RA1 and generate a second random address RA2, and the synchronization output unit 230 is configured to receive the first and second random addresses RA1 and RA2 and to output a synchronization signal OUT in synchronization with a clock signal CLK. The clock signal CLK has a preset frequency and, for example, may include a clock signal used in a read or write operation of the semiconductor memory device.

The signal mixing unit 240 is configured to mix the synchronization signal OUT of the synchronization output unit 230 with data DAT_IN input through the data input unit 250 and output a mixing result to the page buffering unit 260. The data input unit 250 is a circuit for receiving the data DAT_IN input through the data pad 290, and the page buffering unit 260 is a circuit for performing read and write operations and storing data in the memory cell array 270 or outputting the stored data. The data output unit 280 is configured to output data DAT_OUT, which is obtained by mixing data output from the page buffering unit 260 with the synchronization signal OUT of the synchronization output unit 230, to the data pad 290.

Since the semiconductor memory device in accordance with the exemplary embodiment of the present invention mixes data DAT using the first and second random addresses RA1 and RA2, a data randomizing operation may be performed at a speed twice as fast as that in the convention art, that is, read and write operations may be performed at a speed twice as fast as that in the convention art, which will be described later.

Figure 3:
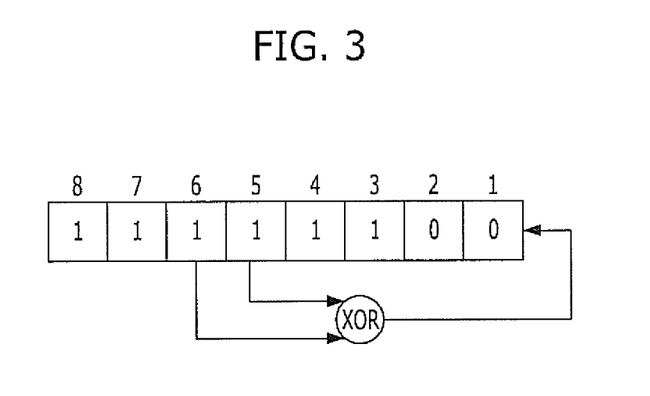
FIG. 3 is a diagram illustrating a schematic operation of a random address generation unit shown in FIG. 2.

FIG. 3 is a diagram illustrating a schematic operation of the random address generation unit 210 shown in FIG. 2. For the illustrative purpose, the first random address RA1 is described to have 63 address values as a signal of, for example, 8 bits.

Referring to FIG. 3, the first random address RA1 is randomized by shifting a bit value from a '1' bit (the least significant bit) to an '8' bit (the most significant bit) and inputting a value obtained by performing an XOR operation on bit values of a '5' bit and a '6' bit as the bit value of the '1' bit. Here, '11111100' may denote an initial value of the first random address RA1. The first random address RA1 has 63 address values through such an operation, which will be described again with reference to FIG. 5.

Figure 4:
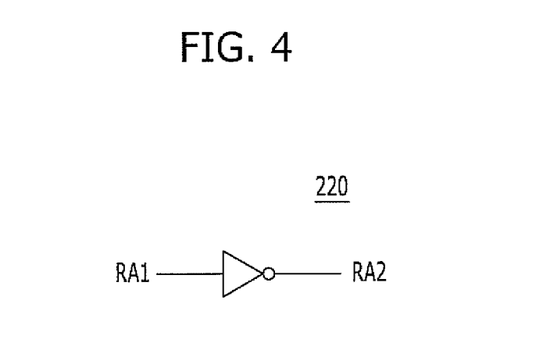
FIG. 4 is a circuit diagram illustrating an address conversion circuit shown in FIG. 2.

FIG. 4 is a circuit diagram illustrating the address conversion circuit 220 shown in FIG. 2.

Referring to FIG. 4, the address conversion circuit 220 includes an inverter configured to output the second random address RA2 by inverting the first random address RA1. The present invention may also be designed to have other logic combinations other than the inverter. The address conversion circuit 220 occupies a very small area as compared with the random address generation unit 210, which represents that a minimum circuit area may be used in order to generate the first and second random addresses RA1 and RA2.

Figure 5:
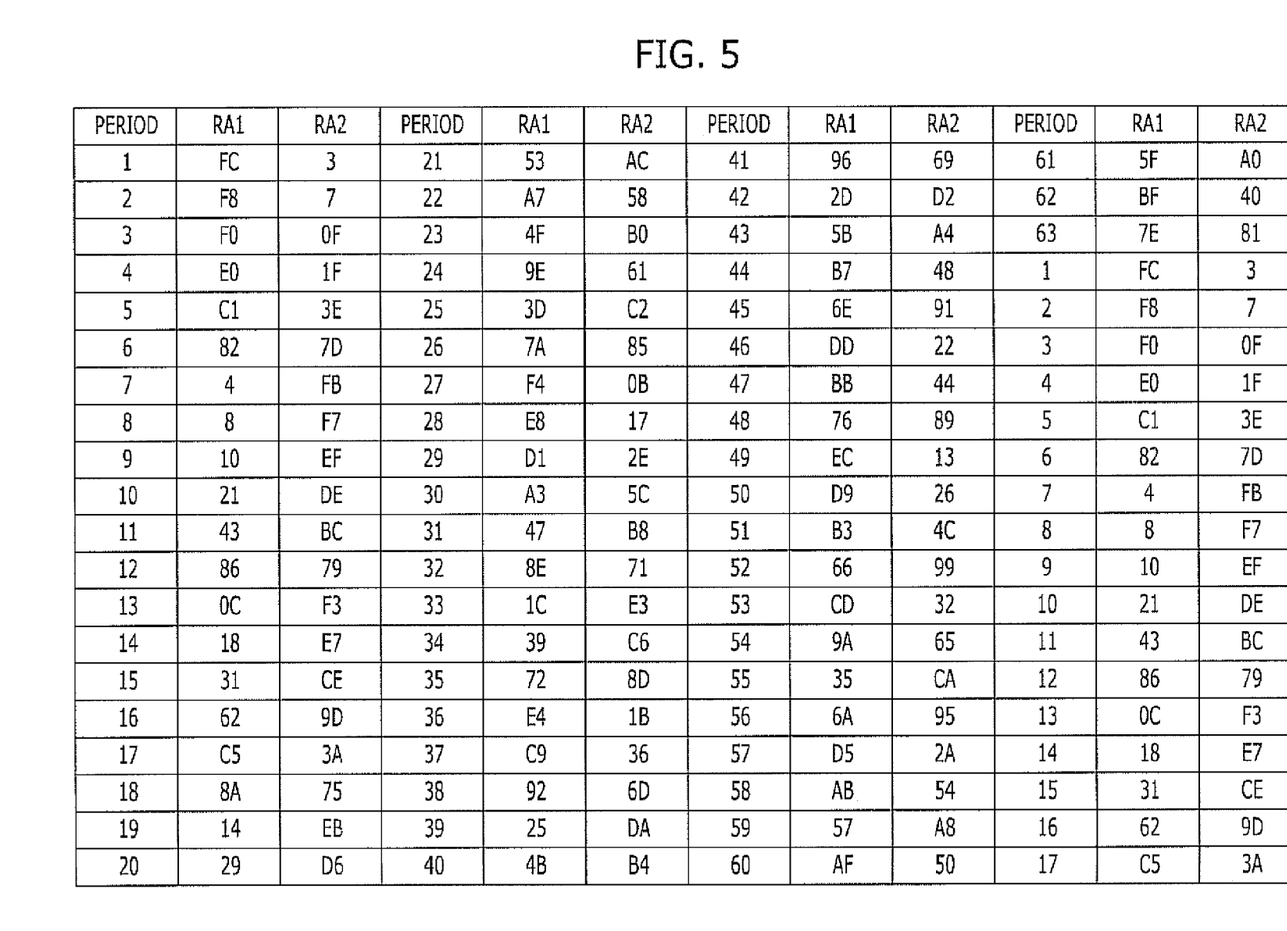
FIG. 5 is a diagram illustrating address values of a first random address and a second random address shown in FIG. 2.

FIG. 5 is a diagram illustrating address values of the first random address RA1 and the second random address RA2 shown in FIG. 2. As can be seen from FIG. 5, the first random address RA1 has 63 periods, and the second random address RA2 obtained by inverting the first random address RA1 also has 63 periods.

Figure 6:
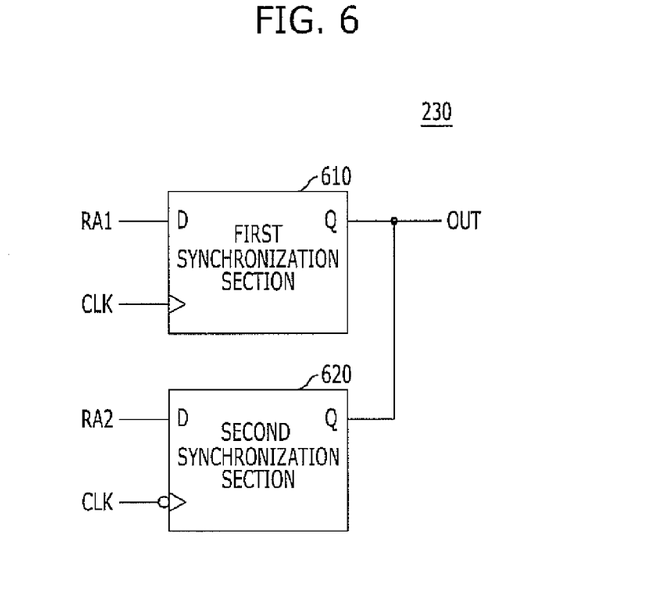
FIG. 6 is a diagram illustrating a synchronization output unit shown in FIG. 2.

FIG. 6 is a diagram illustrating the synchronization output unit 230 shown in FIG. 2.

Referring to FIG. 6, the synchronization output unit 230 includes a first synchronization section 610 for outputting the first random address RA1 in synchronization with the clock signal CLK, and a second synchronization section 620 for outputting the second random address RA2 in synchronization with a clock signal obtained by inverting the clock signal CLK. Thus, the synchronization output unit 230 is configured to sequentially output the first random address RA1 and the second random address RA2 as the synchronization signal OUT in response to the rising edge and the falling edge of the clock signal CLK.

Referring again to FIG. 2, the first random address RA1 and the second random address RA2, which are sequentially output, are input to the signal mixing unit 240 as the synchronization signal OUT, and the signal mixing unit 240 mixes the synchronization signal OUT of the synchronization output unit 230 with the data DAT_IN input through the data input unit 250 in a write operation or the data output through the page buffering unit 260 in a read operation. When considering that the first random address RA1 and the second random address RA2 are generated as the synchronization signal OUT in response to the clock signal CLK, it can be understood that the signal mixing unit 240 also performs the mixing operation in response to the clock signal CLK.

Figure 7:
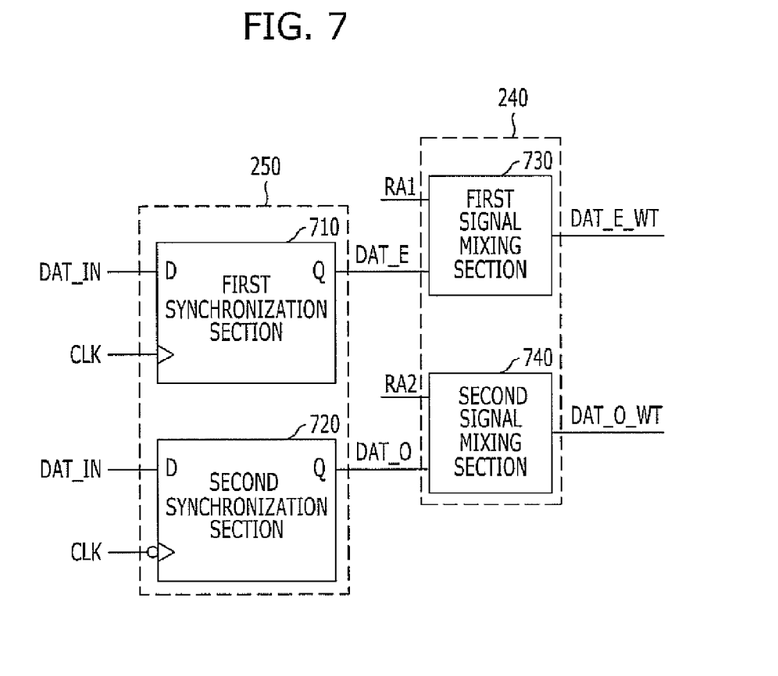
FIG. 7 is a diagram illustrating a signal mixing unit 240 and a data input unit shown in FIG. 2.

FIG. 7 is a diagram illustrating the signal mixing unit 240 and the data input unit 250 shown in FIG. 2. For the purpose of description, the first random address RA1 and the second random address RA2 are input to the signal mixing unit 240 without passing through the synchronization output unit 230.

Referring to FIG. 7, the data input unit 250 is configured to sequentially output the data DAT_IN input through the data pad 290 in synchronization with the clock signal CLK and includes a first synchronization section 710 and a second synchronization section 720. The first synchronization section 710 is configured to output the data DAT_IN in response to the rising edge of the clock signal CLK, and the second synchronization section 720 is configured to output the data DAT_IN in response to the falling edge of the clock signal CLK.

The signal mixing unit 240 is configured to mix the first and second random addresses RA1 and RA2 with output signals DAT_E and DAT_O of the first and second synchronization sections 710 and 720, which correspond to the first and second random addresses RA1 and RA2, and includes a first signal mixing section 730 and a second signal mixing section 740. The first signal mixing section 730 is configured to mix the first random address RA1 with the output signal of the first synchronization section 710, and the second signal mixing section 740 is configured to mix the second random address RA2 with the output signal of the second synchronization section 720.

Figure 8:
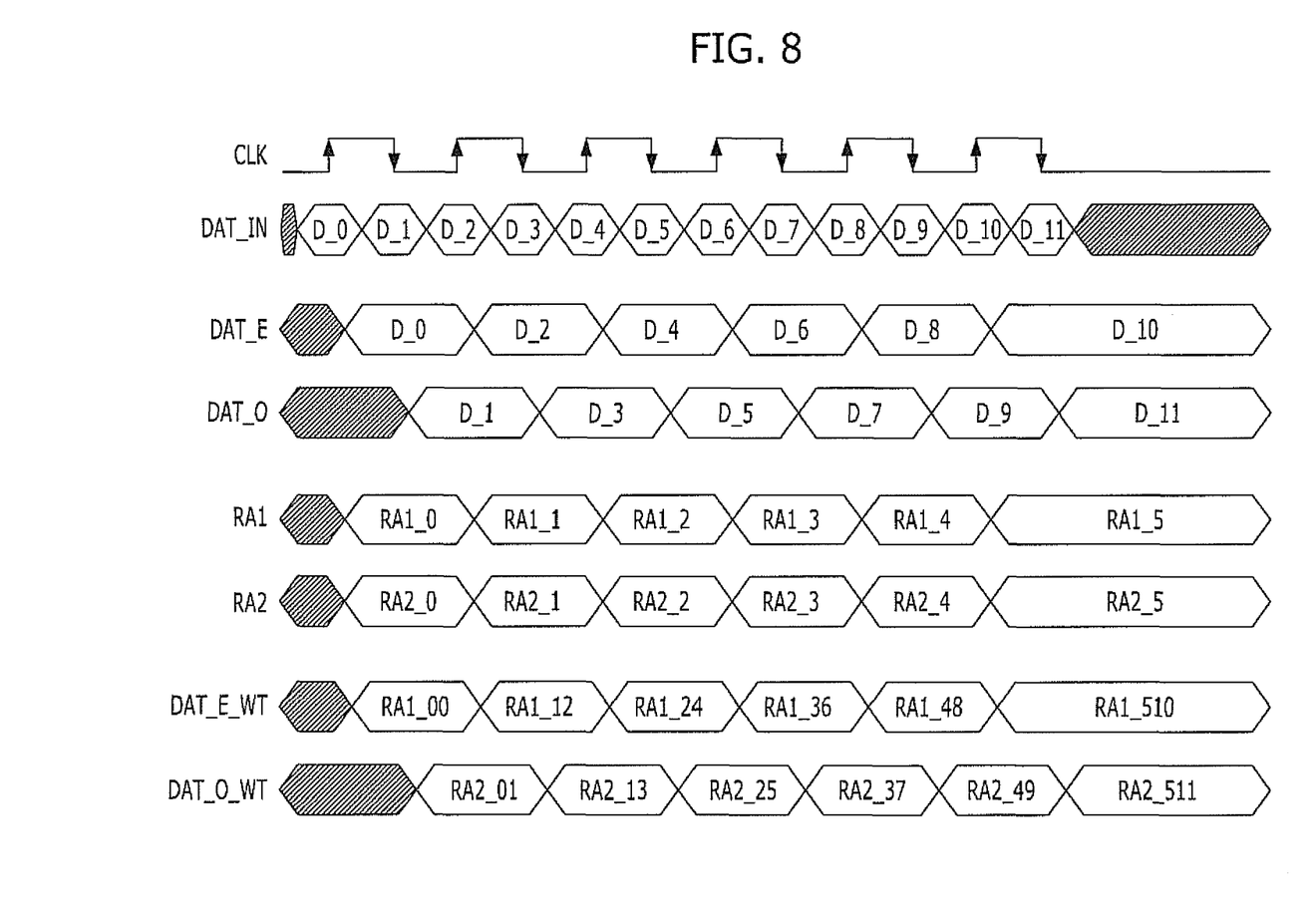
FIG. 8 is a timing diagram illustrating the operation of a circuit shown in FIG. 7.

FIG. 8 is a timing diagram illustrating the operation of the circuit shown in FIG. 7.

As seen from FIG. 8, the data DAT_IN is input in response to the rising and falling edges of the clock signal CLK, and the first and second synchronization sections 710 and 720 (referring to FIG. 7) output the signals DAT_E and DAT_O by synchronizing the data DAT_IN with the clock signal CLK. The first signal mixing section 730 outputs a signal DAT_E_WT by mixing the output signal DAT_E of the first synchronization section 710 with the first random address RA1, and the second signal mixing section 740 outputs a signal DAT_O_WT by mixing the output signal DAT_O of the second synchronization section 720 with the second random address RA2.

As a consequence, the semiconductor memory device in accordance with the embodiment of the present invention may randomize the data DAT_IN, which is input in response to the rising and falling edges of the clock signal CLK, using the first random address RA1 and the second random address RA2.

Figure 9:
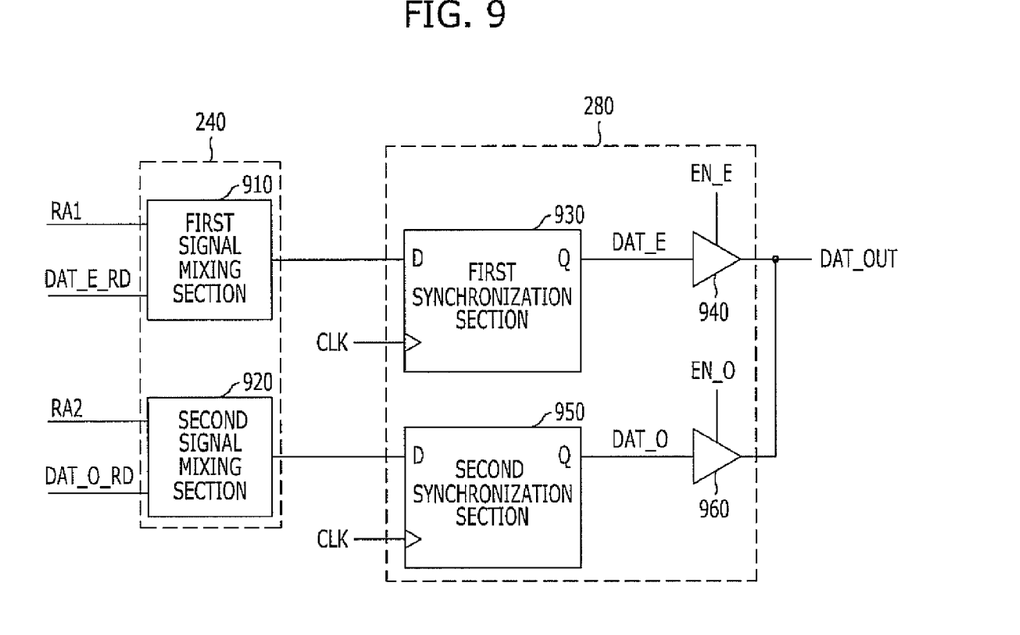
FIG. 9 is a diagram illustrating a signal mixing unit 240 and a data output unit shown in FIG. 2.

FIG. 9 is a diagram illustrating the signal mixing unit 240 and the data output unit 280 shown FIG. 2. For the purpose of description, the first random address RA1 and the second random address RA2 are input to the signal mixing unit 240 without passing through the synchronization output unit 230.

Referring to FIG. 9, the signal mixing unit 240 is configured to mix the first and second random addresses RA1 and RA2 with data DAT_E_RD and DAT_O_RD, which correspond to the first and second random addresses RA1 and RA2, and includes a first signal mixing section 910 and a second signal mixing section 920. The first signal mixing section 910 is configured to mix the first random address RA1 with the data DAT_E_RD, and the second signal mixing section 920 is configured to mix the second random address RA2 with the data DAT_O_RD. The data DAT_E_RD corresponding to the first random address RA1 and the data DAT_O_RD corresponding to the second random address RA2 are output from the page buffering unit 260 in the read operation.

The data output unit 280 is configured to sequentially output the output signals of the first and second signal mixing sections 910 and 920 in synchronization with the clock signal CLK and includes a first synchronization section 930, a first output section 940, a second synchronization section 950, and a second output section 960. The first synchronization section 930 is configured to output the output signal of the first signal mixing section 910 as an output signal DAT_E in response to the rising edge of the clock signal CLK, and the first output section 940 is configured to output the output signal DAT_E as an output data DATA_OUT in response to a first activation signal EN_E. The second synchronization section 950 is configured to output the output signal of the second signal mixing section 920 as an output signal DAT_O in response to the rising edge of the clock signal CLK, and the second output section 960 is configured to output the output signal DAT_O as the output data DATA_OUT in response to a second activation signal EN_O. The first and second activation signals EN_E and ENO correspond to the rising and falling edges of the clock signal CLK in the read operation.

Figure 10:
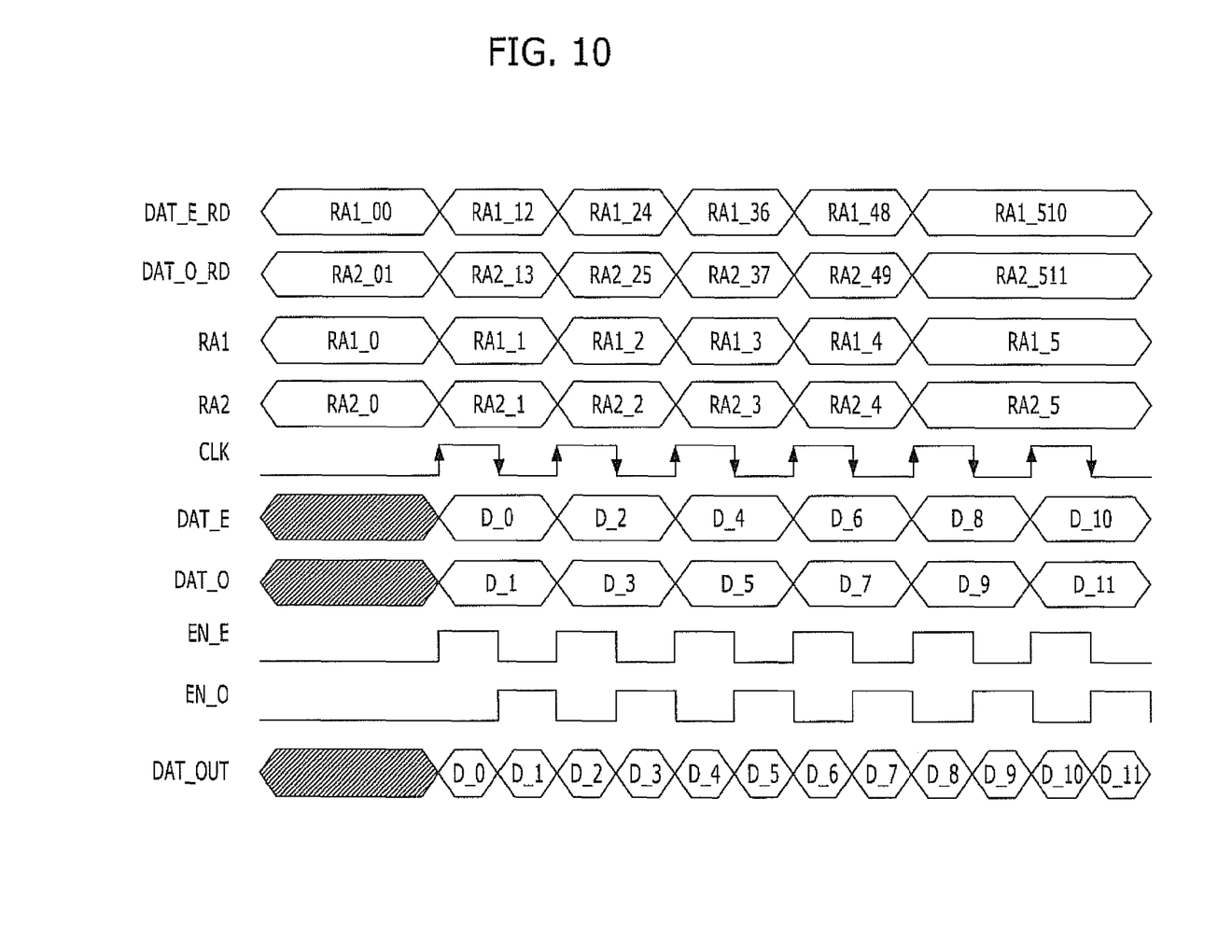
FIG. 10 is a timing diagram illustrating the operation of a circuit shown in FIG. 9.

FIG. 10 is a timing diagram illustrating the operation of the circuit shown in FIG. 9.

Referring to FIG. 10, the data DAT_E_RD and DAT_O_RD output from the page buffering unit 260 (referring to FIG. 2) are mixed with the first random address RA1 and the second random address RA2, respectively. The data output unit 280 generates the output signals DAT_E and DAT_O of the first and second signal mixing sections 910 and 920 in synchronization with the clock signal CLK and sequentially outputs the output signals DAT_E and DAT_O as the output data DAT_OUT in response to the first activation signal EN_E and the second activation signal EN_O.

As a consequence, the semiconductor memory device in accordance with the embodiment of the present invention may perform a de-randomizing operation with respect to the data DATA_OUT, which is to be output in response to the rising and falling edges of the clock signal CLK, using the first random address RA1 and the second random address RA2.

As described above, the integrated circuit in accordance with the embodiment of the present invention may generate the first random address RA1 and the second random address RA2 with a minimum configuration. Furthermore, the semiconductor memory device provided with the integrated circuit may perform read and write operations at a speed faster than that in the convention art by using the first random address RA1 and the second random address RA2.

According to the embodiment of the present invention, the size of an integrated circuit for generating first and second random addresses may be minimized.

Furthermore, the operation speed of a semiconductor memory device may be increased by performing a data randomizing operation using the first and second random addresses in response to a clock signal.

While the present invention has been described with respect to the specific embodiments, it will be apparent to those skilled in the art that various changes and modifications may be made without departing from the spirit and scope of the invention as defined in the following claims.

In addition, the position and type of the logic gate and transistor described in the above-mentioned embodiment may be changed depending on the polarity of an input signal.

What is claimed is:

1. An integrated circuit comprising:
   a random address generation unit configured to generate a first random address for a data randomizing operation;
   an address conversion unit configured to convert the first random address and generate a second random address; and
   a synchronization output unit configured to sequentially output the first and second random addresses in synchronization with a clock signal.

2. The integrated circuit of claim 1, wherein the address conversion unit is configured to convert the first random address to the second random address by logically combining the first random address with a set value.

3. The integrated circuit of claim 1, wherein the address conversion unit is configured to output the second random address by inverting the first random address.

4. The integrated circuit of claim 1, wherein the first random address corresponds to a first edge of the clock signal and the second random address corresponds to a second edge of the clock signal.

5. A semiconductor memory device comprising:
   a random address generation unit configured to generate a first random address for a data randomizing operation;
   an address conversion unit configured to convert the first random address and generate a second random address; and
   a signal mixing unit configured to mix the first and second random addresses with data to output mix data.

6. The semiconductor memory device of claim 5, wherein the signal mixing unit is configured to perform a mixing operation of the first and second random addresses and the data in response to a clock signal.

7. The semiconductor memory device of claim 6, wherein the first random address corresponds to a first edge of the clock signal and the second random address corresponds to a second edge of the clock signal.

8. The semiconductor memory device of claim 5, further comprising:
   a synchronization output unit configured to sequentially output the first and second random addresses to the signal mixing unit in synchronization with a clock signal.

9. The semiconductor memory device of claim 5, further comprising:
   a data input unit configured to receive input data and sequentially output the input data as the data to the signal mixing unit in synchronization with a clock signal; and
   a page buffering unit configured to store the mix data in a memory cell array.

10. The semiconductor memory device of claim 5, further comprising:
    a page buffering unit configured to output data from a memory cell array as the data to the signal mixing unit; and
    a data output unit configured to sequentially output the mix data in synchronization with a clock signal.

11. The semiconductor memory device of claim 5, wherein the address conversion unit is configured to convert the first random address to the second random address by logically combining the first random address with a set value.

12. The semiconductor memory device of claim 5, wherein the address conversion unit is configured to output the second random address by inverting the first random address.

13. A method for operating a semiconductor memory device, the method comprising:
    generating a first random address for a data randomizing operation, and generating a second random address by converting the first random address;
    outputting mix data by mixing the first and second random addresses with data; and
    storing the mix data in a memory cell array.

14. The method of claim 13, wherein the outputting of the mix data comprises:
    mixing the first random address with first data in response to a first edge of a clock signal; and
    mixing the second random address with second data in response to a second edge of the clock signal.

15. The method of claim 13, further comprising:
    synchronizing the first and second random addresses with a clock signal before the mixing of the first and second random addresses with the data.

16. The method of claim 13, further comprising:
    receiving input data and sequentially outputting the input data as the data in synchronization with a clock signal before the mixing of the first and second random addresses with the data.

17. The method of claim 13, further comprising:
    sequentially outputting the mix data in synchronization with a clock signal.

18. The method of claim 13, wherein, in the generating of the second random address, the first random address is logically combined with a set value.

19. The method of claim 13, wherein the second random address is generated by inverting the first random address.

* * * * *